(12) United States Patent
Wakasa

(10) Patent No.: US 7,889,581 B2
(45) Date of Patent: Feb. 15, 2011

(54) DIGITAL DLL CIRCUIT

(75) Inventor: Shinji Wakasa, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/477,672

(22) Filed: Jun. 3, 2009

(65) Prior Publication Data

US 2009/0238017 A1 Sep. 24, 2009

Related U.S. Application Data

(63) Continuation of application No. PCT/JP2006/324275, filed on Dec. 5, 2006.

(51) Int. Cl.
*G11C 7/00* (2006.01)
(52) U.S. Cl. .................................... 365/194; 365/233.5
(58) Field of Classification Search ................. 365/194, 365/233.5
See application file for complete search history.

(56) References Cited

U.S. PATENT DOCUMENTS 6,466,491 B2 * 10/2002 Yanagawa ................... 365/194

2004/0222828 A1 * 11/2004 Ishikawa ..................... 327/156
2005/0286320 A1 * 12/2005 Iwasaki ................... 365/189.05
2006/0140022 A1 * 6/2006 Lee ............................. 365/193

FOREIGN PATENT DOCUMENTS

| JP | 8-321753 A | 12/1996 |
|---|---|---|
| JP | 2006-085650 A | 3/2006 |
| JP | 2006-107352 A | 4/2006 |

* cited by examiner

*Primary Examiner*—Michael T Tran
(74) *Attorney, Agent, or Firm*—Fujitsu Patent Center

(57) ABSTRACT

A digital delay locked loop circuit generates a delay value to delay the timing of taking in read-data by a memory interface when data is read from a memory. The digital delay locked loop circuit includes a selector that selects either one of a clock signal and a data strobe signal as a signal to output; a delay line that induces delay on the signal output from the selector when the signal passes through the delay line; and a phase-comparing/delay-value determining unit that compares a phase of the clock signal and a phase of the signal output from the delay line, and that determines a delay value that defines an amount of delay to be induced on the data strobe signal when passing through the delay line.

11 Claims, 18 Drawing Sheets

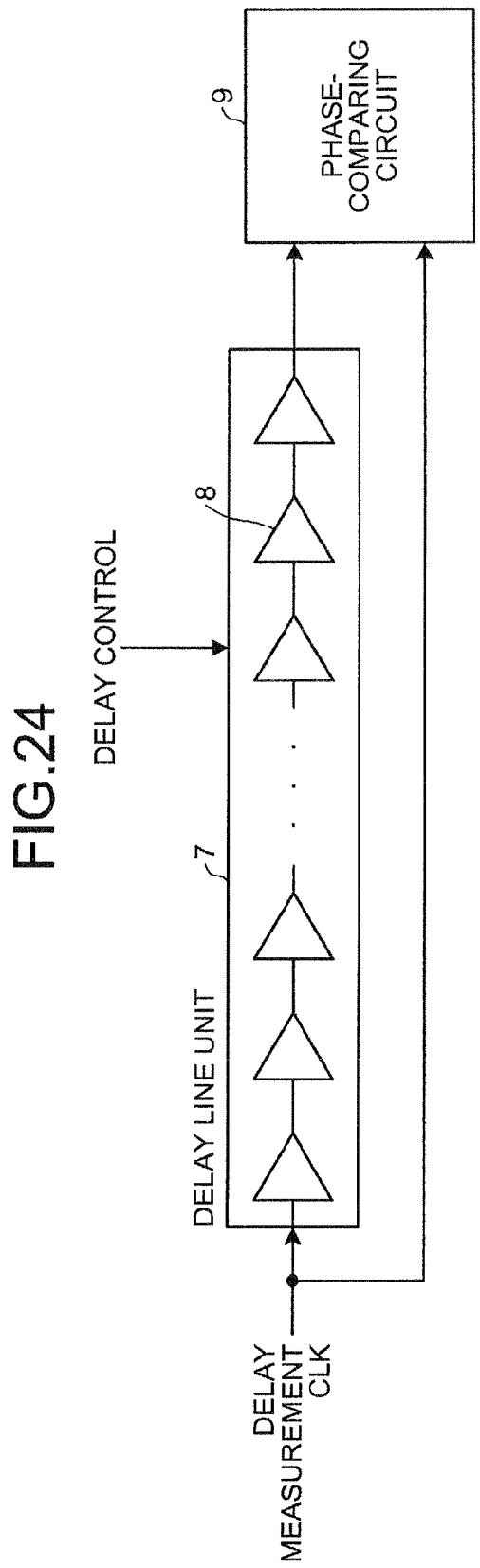

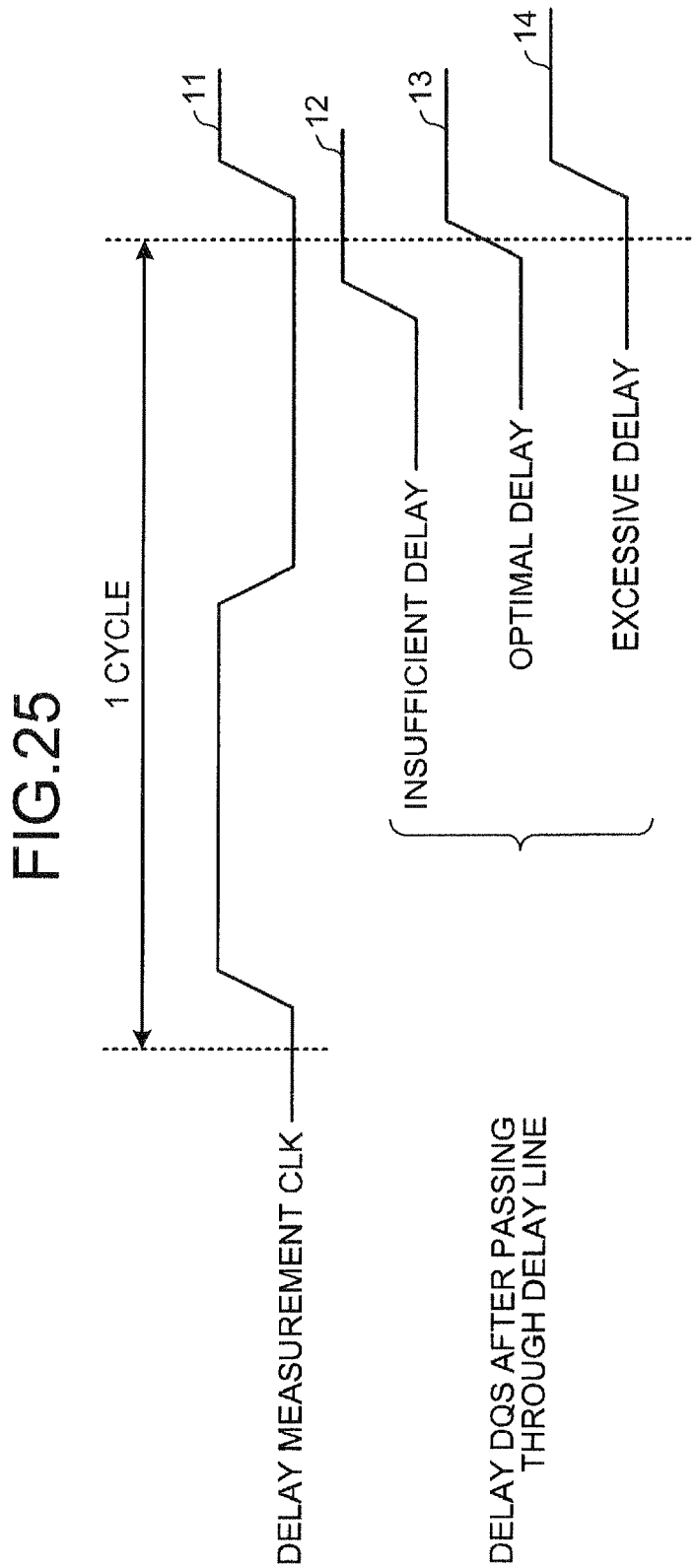

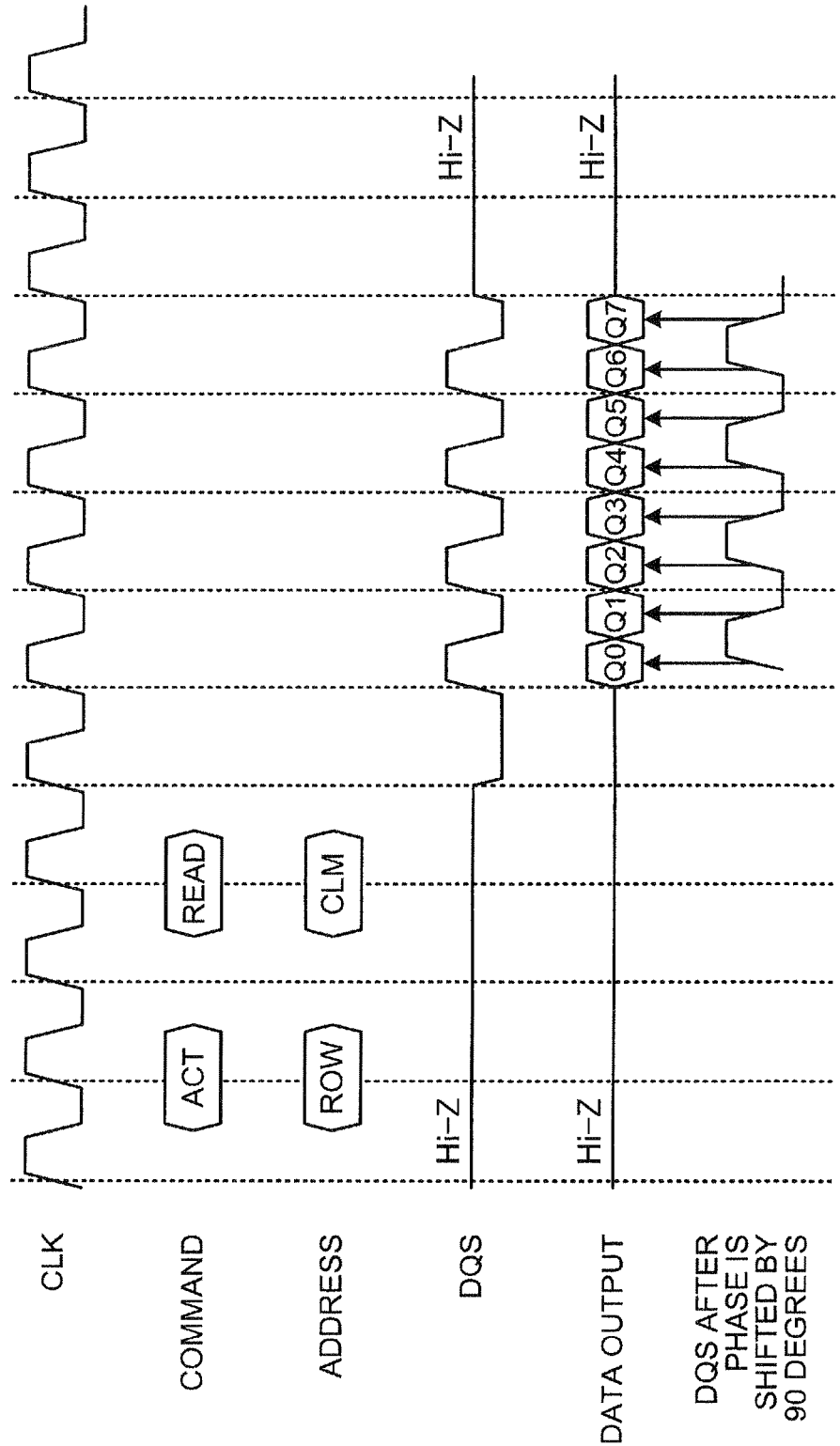

US 7,889,581 B2

DIGITAL DLL CIRCUIT

CROSS-REFERENCE TO RELATED APPLICATION

This application is a continuation of prior International Patent Application No. PCT/JP2006/324275, filed on Dec. 5, 2006, and published as WO 2008/068851 on Jun. 12, 2008, the entire contents of which are incorporated herein by reference.

FIELD

The embodiment discussed herein is related to a digital delay locked loop (DLL) circuit.

BACKGROUND

In recent years, in the fields of consumer electronics, advanced communication devices, and the like, the interface of semiconductor memory has been changing from a single data rate (SDR) that enables operation at the same speed as clock signals to a double data rate (DDR) that enables operation at a speed twice as fast as clock signals. In the DDR memory interface, read data is taken in using both rising and falling edges of a clock signal. Accordingly, a precise delay circuit to match a rising edge or a falling edge of a clock signal with a defined part of the data is required. Among such precise delay circuits is a digital DLL circuit.

FIG. 23 is a schematic depicting a configuration of a conventional digital DLL circuit. As depicted in FIG. 23, the conventional digital DLL circuit includes a reference-delay determining circuit 1 and a delay output circuit 2, separately. The reference-delay determining circuit 1, using a phase-comparing/reference-delay-determining circuit 4 and while changing the number of delay lines in the delay line unit 3, compares the phases of a clock signal subject to delay measurement (hereinafter, "delay-measurement clock signal") before and after the clock signal passes through a delay line unit 3, to determine a reference delay value. The reference delay value is given to multiple delay output circuits 2 as a digitalized value expressed by a predetermined number of bits.

The delay output circuit 2 determines a final delay value by a final-delay-value determining circuit 5, based on the reference delay value given by the reference-delay determining circuit 1 and a delay angle set externally. The delay output circuit 2 sets the final delay value in a delay line unit 6 that is in the delay output circuit 2. Thus, a delay of, for example, 90 degrees is induced on a data strobe (DQS) signal that has passed the delay line unit 6 of the delay output unit 2 at the time of data read, as described later.

FIG. 24 is a schematic for explaining a principle of a delay measuring method by conventional phase comparison, and FIG. 25 is a view of waveforms at the time of delay measurement. As depicted in FIG. 24, in the phase comparison, while changing the number of delay lines 8 of a delay line unit 7 through which a delay measurement clock signal passes, a phase comparing circuit 9 compares a phase of a delay measurement clock signal that has not passed the delay line unit 7 and a phase of a delay measurement clock signal (hereinafter, "delay clock signal") that has passed the delay line unit 7.

As depicted in FIG. 25, when the result of the phase comparison indicates that the value of a delay clock signal 12 is at a high (H) level at a rising edge in the subsequent cycle of a delay measurement clock signal 11, delay is regarded to be insufficient, and when the result indicates that the value of a delay clock signal 14 is at a low (L) level, delay is regarded to be excessive. When optimal delay is induced, the rising edge of the delay measurement clock signal 11 corresponds with a changing portion of a delay clock signal 13.

A phase comparing circuit latches a state of a delay clock signal in synchronization with the rising edge of the delay measurement clock signal by a flip-flop. When configuration of the circuit is such to confirm the value of the delay clock signal at this time, the value latched by the flip-flop becomes unstable (H level or L level) when the optimal delay is induced. Therefore, typically, the phase comparison of the delay measurement clock signal and a delay clock signal is performed for three cases in which the number of the delay lines is [m−1], m, and [m+1], and based on three values acquired from the comparison, the number of the delay lines that is required to optimize the delay is acquired.

FIG. 26 is a time chart at the time of memory read in a typical DDR memory interface. A digital DLL circuit is used to induce delay on a data strobe signal in order to ensure acquisition of read data at the time of read data based on the data strobe signal that is a memory access signal output from a memory. Ideally, timing in which a 90-degree delay is induced on the data strobe signal is desirable as depicted in FIG. 26 by "data output" and "DQS after a phase shift of 90 degrees" because such timing is a central point of a data determination area.

The number of delay lines required to induce a delay of 360 degrees, that is, one cycle of the delay measurement clock signal, is calculated by measurement, such as the phase comparison described above, and the like. Because the cycle of a data strobe signal is the same as the cycle of the delay measurement clock signal, the value to induce a delay of 90 degrees to the data strobe signal is ¼ of the value to induce a delay of 360 degrees to the delay measurement clock signal. Specifically, when 256 delay lines are required to generate delay of 360 degrees, for example, 64 delay lines, which is ¼ of 256, are required to generate a delay of 90 degrees.

Moreover, in the DDR memory interface, if the phase of the data strobe signal shifts 180 degrees or more, a data area that is captured at the subsequent edge of the data strobe signal is entered, and therefore, a delay of 180 degrees or more is not to be induced on the data strobe signal. Accordingly, as depicted in FIG. 23, half of the number of the delay lines (for 360 degrees) in the delay line unit 3 of the reference-delay determining circuit 1 is enough for the number of delay lines in the delay line unit 6 of the delay output circuit 2.

A clock generating circuit is conventionally known that generates multiple delay clocks having a cycle identical to that of a basic clock signal (for example, Japanese Laid-Open Patent Publication No. H8-321753). The delay-clock generating circuit includes cascade-connected n stages of delay circuits that sequentially delay the basic clock (n is an integer equal to or larger than 2), a phase comparing circuit that compares phases between a delay clock obtained through the n-th delay circuit and the basic clock, and a delay control circuit that generates a delay value to synchronize phases of the delay clock from the n-th delay circuit and the basic clock, and that controls an amount of delay of each of the n stages of the delay circuits by the delay value.

However, in the conventional digital DLL circuit, because the reference delay determining circuit and the delay output circuit are provided separately, various problems arise. A process condition at manufacturing, or a temperature or voltage condition at actual utilization can vary in the both circuits, and the delay output circuit cannot accurately generate the delay determined by delay measurement performed by the reference-delay determining circuit. Furthermore, because the reference delay determining circuit and the delay output circuit have delay lines separately, the scale of the circuit is large. In addition, if the scale of the DLL circuit is large, power consumption increases. Moreover, update of the delay value when delay is induced on the data strobe signal in the delay output circuit causes malfunction.

SUMMARY

According to an aspect of an embodiment, a digital delay locked loop circuit generates a delay value to delay the timing of taking in read-data by a memory interface when data is read from a memory. The digital delay locked loop circuit includes a selector that selects either one of a clock signal and a data strobe signal as a signal to output; a delay line that induces delay on the signal output from the selector when the signal passes through the delay line; and a phase-comparing/delay-value determining unit that compares a phase of the clock signal and a phase of the signal output from the delay line, and that determines a delay value that defines an amount of delay to be induced on the data strobe signal when passing through the delay line.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 24 is a schematic for explaining a principle of a delay measuring method by conventional phase comparison;

FIG. 25 is a view of waveforms at the time of delay measurement; and

FIG. 26 is a time chart at the time of memory read in a typical DDR memory interface.

DESCRIPTION OF EMBODIMENTS

Preferred embodiments of the present invention will be explained with reference to the accompanying drawings.

Figure 1:
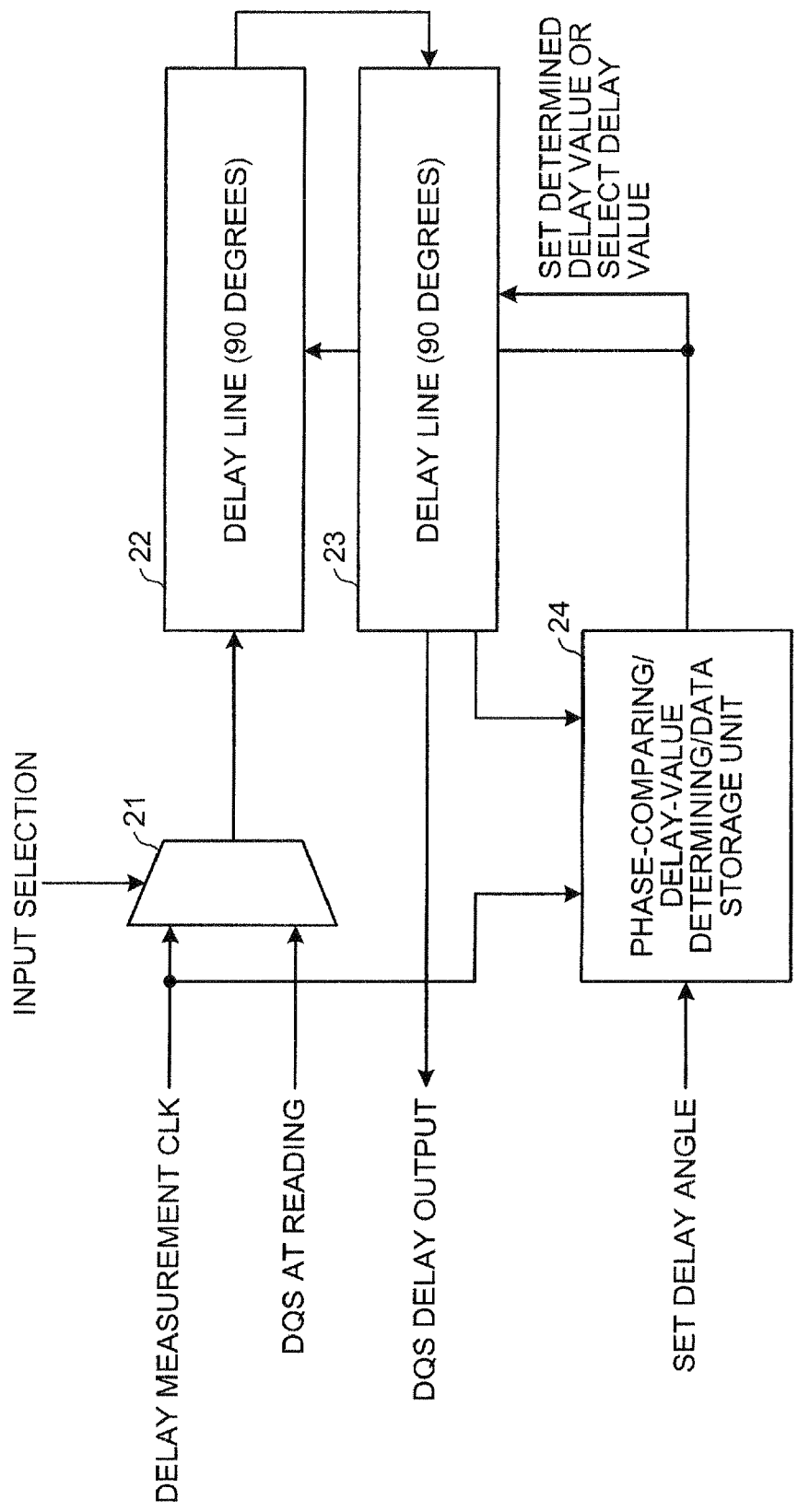
FIG. 1 is a schematic depicting a configuration of a digital DLL circuit according to an embodiment of the present invention.

FIG. 1 is a schematic depicting a configuration of a digital DLL circuit according to an embodiment of the present invention. As depicted in FIG. 1, the digital DLL circuit according to the embodiment includes, for example, a selector 21, a delay line unit constituted by delay lines 22 and 23, and a phase-comparing/delay-value determining/data storage unit 24. The selector 21 selects a delay measurement clock signal to be subject to delay measurement during a delay measurement mode, and selects a data strobe signal during a delay generation mode, based on an input selecting signal that is provided by a memory access controller (not depicted).

The delay measurement mode is a mode during which measurement of a reference delay value is performed, and the delay generation mode is a mode during which a delay of, four example, 90 degrees is induced on a data strobe signal. The signal selected by the selector 21 is input to the delay lines 22 and 23. The delay lines 22 and 23 output a signal obtained by inducing delay to the signal output from the selector 21 to the phase-comparing/delay-value determining/data storage unit 24; and during the delay generation mode, the delay lines 22 and 23 output to a DDR memory interface (not depicted), a DQS delay output signal that is the data strobe signal to which desirable delay has been induced.

The number of delay lines through which the signal output from the selector 21 passes in the delay line unit, that is, delay to be induced on the signal output from the selector 21, is controlled by a delay-value selecting signal (during the delay measurement mode) output from the phase-comparing/delay-value determining/data storage unit 24 or a determined-delay-value setting signal (during the delay generation mode). As described, the digital DLL circuit according to the embodiment is configured to use the same delay lines 22 and 23 during both the delay measurement mode and the delay generation mode.

To the phase-comparing/delay-value determining/data storage unit 24, a delay measurement clock signal that has not passed through the delay lines 22 and 23 and a delay clock signal that has passed the delay lines 22 and 23, are input during the delay measurement mode. The phase-comparing/ delay-value determining/data storage unit 24 compares the phase of the delay measurement clock signal and the phase of the delay clock signal, during the delay measurement mode. Based on a result of the comparison, the reference delay value is determined or updated.

Here, the delay measurement method is identical to the delay measurement method by the conventional phase comparison that is explained with reference to FIG. 24 and FIG. 25, and therefore, detailed explanation thereof is omitted. Details of a configuration and a method for updating the reference delay value are described later.

Moreover, to the phase-comparing/delay-value determining/data storage unit 24, a delay measurement signal that has not passed through the delay lines 22 and 23 and a data strobe signal (hereinafter, "delay data strobe signal") that has been delayed by passing through the delay lines 22 and 23 are input during the delay generation mode. A phase comparing circuit of the phase-comparing/delay-value determining/data storage unit 24 compares the phase of a falling edge of the delay data strobe signal and the phase of a falling edge of the delay measurement clock signal during the delay generation mode. Based on a result of the comparison, fluctuation of the delay value is detected and the reference delay value is updated.

The reason for comparing the phase of the falling edge of the delay data strobe signal and the phase of the falling edge of the delay measurement clock signal is described later. Further, details of a configuration and a method for updating the reference delay value based on a data strobe signal are described later.

To the delay lines 22 and 23, a delay-angle setting signal is input from an external source. The delay-value determining circuit of the phase-comparing/delay-value determining/data storage unit 24 determines, based on the delay angle set externally and, the result of the phase comparison by the phase comparing circuit, the determined, or the updated reference delay value, a final delay value and sets the determined final delay value in the delay lines 22 and 23.

In a data storage area of the phase-comparing/delay-value determining/data storage unit 24, digital data that has been used during the respective modes are stored to switch between the delay measurement mode and the delay determination mode.

Figure 2:
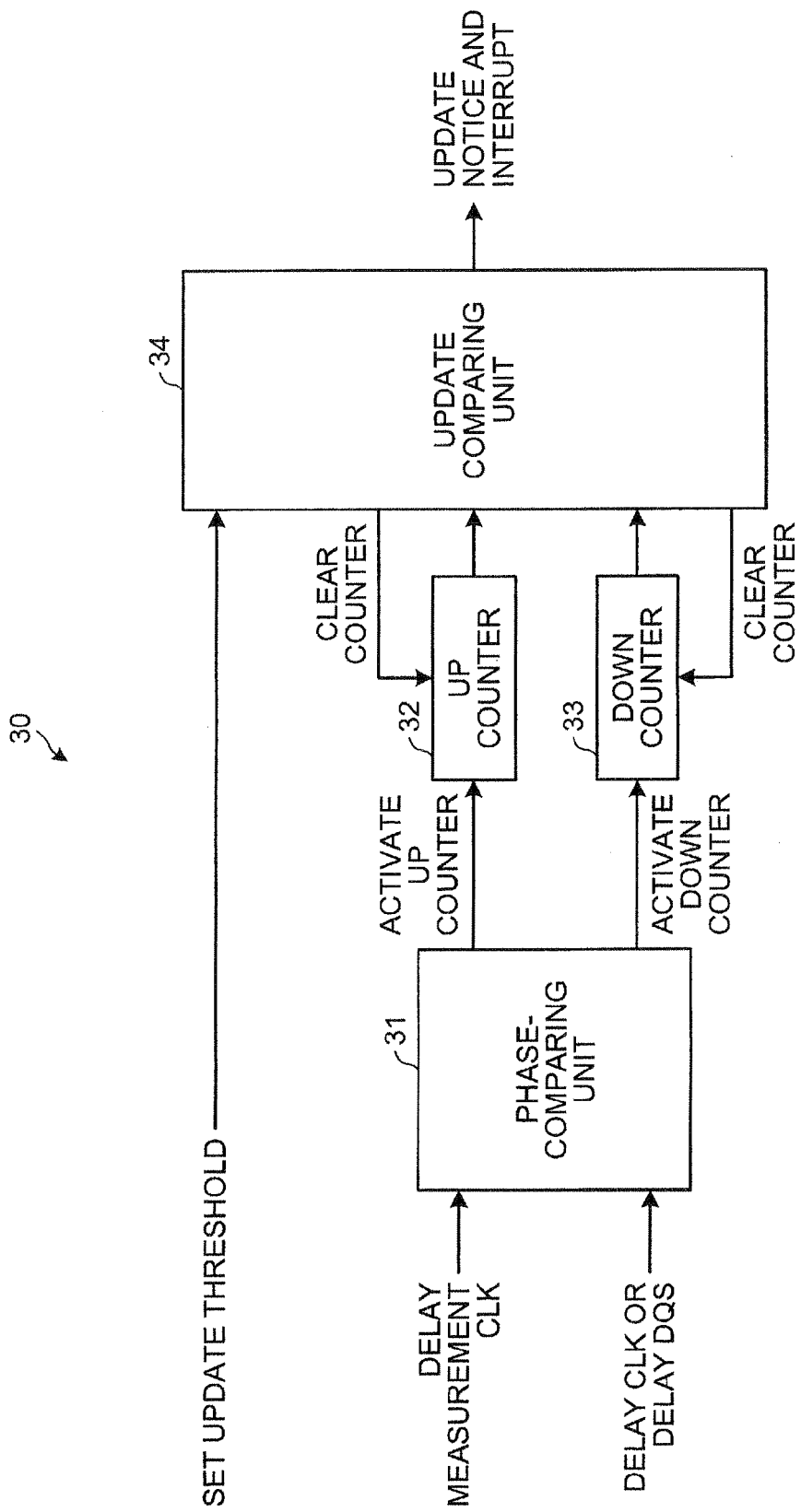
FIG. 2 is a schematic depicting a configuration of a circuit, in the embodiment, that updates a reference delay value following phase comparison.

FIG. 2 is a schematic depicting a configuration of a circuit, in the embodiment, that updates the reference delay value following the phase comparison. As depicted in FIG. 2, a circuit (hereinafter "delay-value updating circuit") 30 that updates the reference delay value includes, for example, a phase comparing circuit 31, an up counter 32, a down counter 33, and a update comparing unit 34. The delay-value updating circuit 30 is included in the phase-comparing/delay-value determining/data storage unit 24.

To the phase comparing circuit 31, the delay measurement clock signal and the delay clock signal are input during the delay measurement mode, and the delay measurement clock signal and the delay data strobe signal are input during the delay generation mode. The phase comparing circuit 31 compares the phase of the delay measurement clock signal and the phase of the delay clock signal, or the phase of a falling edge of the delay data strobe signal and the phase of a falling edge of the delay measurement clock signal. When it is found that delay is insufficient as a result of the comparison, the phase comparing circuit 31 asserts an up-counter activating signal provided to the up counter 32, and when it is found that delay is excessive, the phase comparing circuit 31 asserts a down-counter activating signal provided to a down counter 33.

The up counter 32 and the down counter 33 count up when the up-counter activating signal and the down counter activating signal are asserted, respectively. Counter values of the up counter 32 and the down counter 33 are provided to the update comparing unit 34. The update comparing unit 34 compares the respective counter values of the up counter 32 and the down counter 33 with a threshold.

When the counter value of the up counter 32 exceeds the threshold, the update comparing unit 34 sends, to a memory controller (not depicted), an update notice to update the reference delay value so as to increase the delay, and causes an interrupt. When the counter value of the down counter 33 exceeds the threshold, the update comparing unit 34 sends an update notice to update the reference delay value so as to decrease the delay, and causes an interrupt.

Moreover, upon occurrence of the interrupt, the update comparing unit 34 outputs a counter clear signal to the up counter 32 and the down counter 33, to initialize the respective values of the counters 32 and 33. However, when the data strobe signal is used for a read command, the signal is delayed by inducing delay to the data strobe signal. Therefore, after the read command is over, the update of the reference delay value is performed.

The threshold is arbitrarily set by a user. The threshold is set based on an update-threshold setting signal that is input by an external source. For example, to promptly perform control with respect to a change, the reference delay value can be updated to the number of delay lines newly set when the counter value of the up counter 32 or the down counter 33 becomes 8. Alternatively, in a configuration where an environment does not change largely, the reference delay value can be updated when the up counter 32 or the down counter 33 consecutively counts 1024, to update to the number of delay lines newly determined.

The delay value updating circuit 30 is not limited to the one configured as depicted in FIG. 2. Moreover, the up counter 32 and the down counter 33 can be configured to continue counting without limiting the period, or to count for a predetermined period. Furthermore, configuration may be such that the down counter 33 initializes the counter value when the up counter 32 counts up to a predetermined number, and the up counter 32 initializes the counter value when the down counter 33 counts up to a predetermined number, or configuration may be such that neither of the counters initializes the counter value when the other counter counts up to a predetermined number. By various register settings described later, either configuration can be selected.

Further, the up counter 32 and the down counter 33 can be constituted by a common counter. In this case, for example, the counter continues counting up while the up-counter activating signal is continuously asserted; then, when the down-counter activating signal is asserted, the counter value is initialized to re-start counting up. When the down-counter activating signal is continuously asserted, the counter continues counting up; then, when the up-counter activating signal is asserted, the counter value is initialized to re-start counting up.

Figure 3:
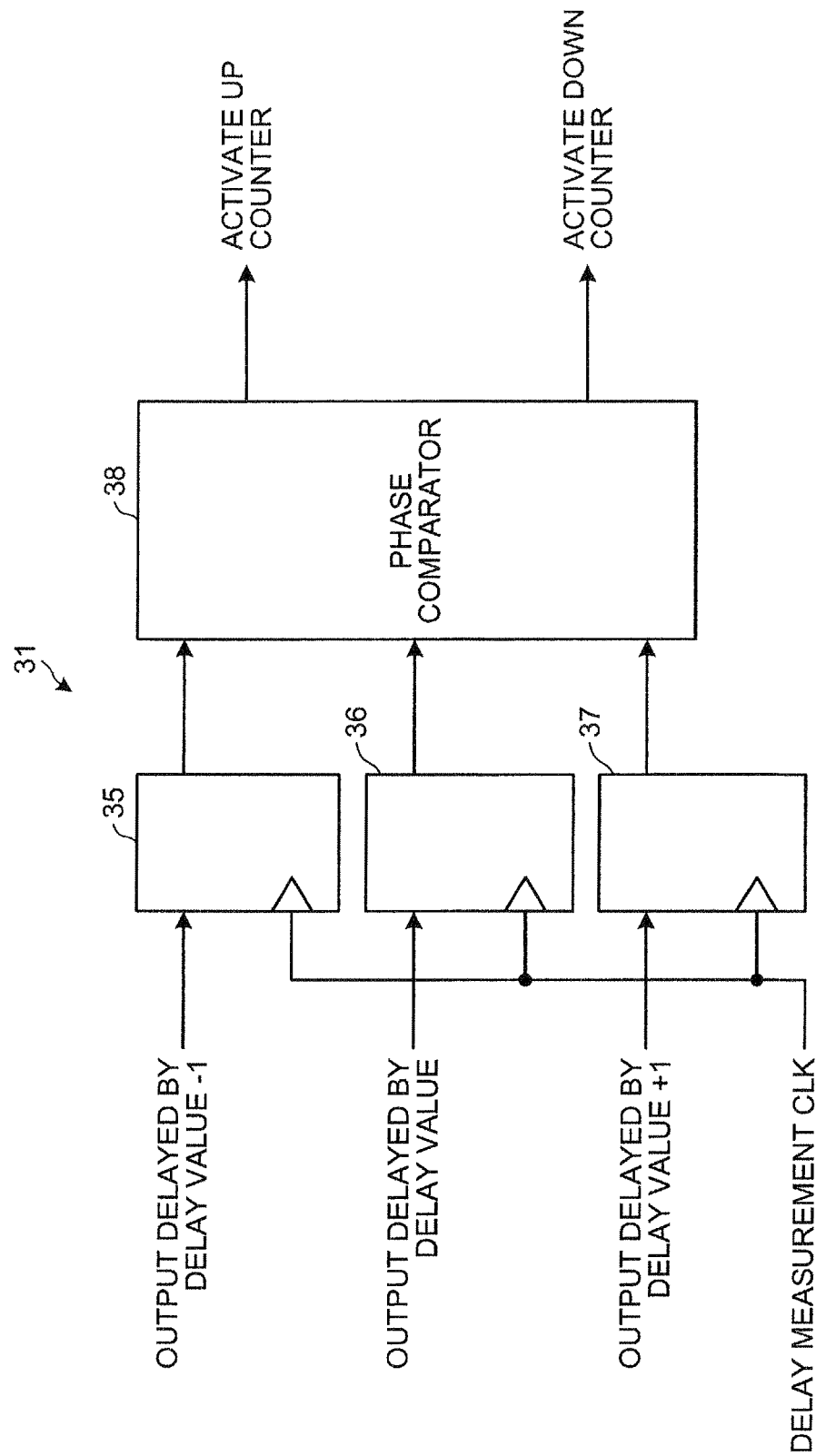
FIG. 3 is a schematic depicting a configuration of a phase comparing circuit.

FIG. 3 is a schematic depicting a configuration of the phase comparing circuit. As depicted in FIG. 3, the phase comparing circuit 31 includes, for example, three flip-flops 35, 36, and 37, and a phase comparator 38. The three flip-flops 35, 36, and 37 latch an input signal in synchronization with the delay measurement clock signal, and output the latched signal to the phase comparator 38. Similarly to the conventional technique, to the phase comparing circuit 31, a signal delayed by a given delay value, a signal delayed by the given delay value less 1, and a signal delayed by the given delay value plus 1 are input as a delay clock signal or a delay data strobe signal.

The signal that is delayed by the given delay value less 1 is input to the first flip-flop 35. The signal that is delayed by the given delay value is input to the second flip-flop 36. The signal that is delayed by the given value plus 1 is input to the third flip-flop 37. When the signals input to the three flip-flops 35, 36, and 37 are the delay clock signals, the signals are as follows. The signals input to the three flip-flops 35, 36, and 37 all become the H (high) level when the delay is insufficient, and all become the L (low) level when the delay is excessive (see FIG. 25).

Moreover, when the delay is optimal, the signals input to the first flip-flop 35 and the third flip-flop 37 are at the H (high) level and the L (low) level, respectively, and the signal input to the second flip-flop 36 is undefined (see FIG. 25). The phase comparator 38 has a logical configuration such that the phase comparator 38 asserts the up-counter activating signal when all of the output signals from the three flip-flops 25, 36, and 37 are at the H (high) level, and asserts the down-counter activating signal when all of the output signals are at the L (low) level, and asserts neither activating signal in other cases.

Figure 4:
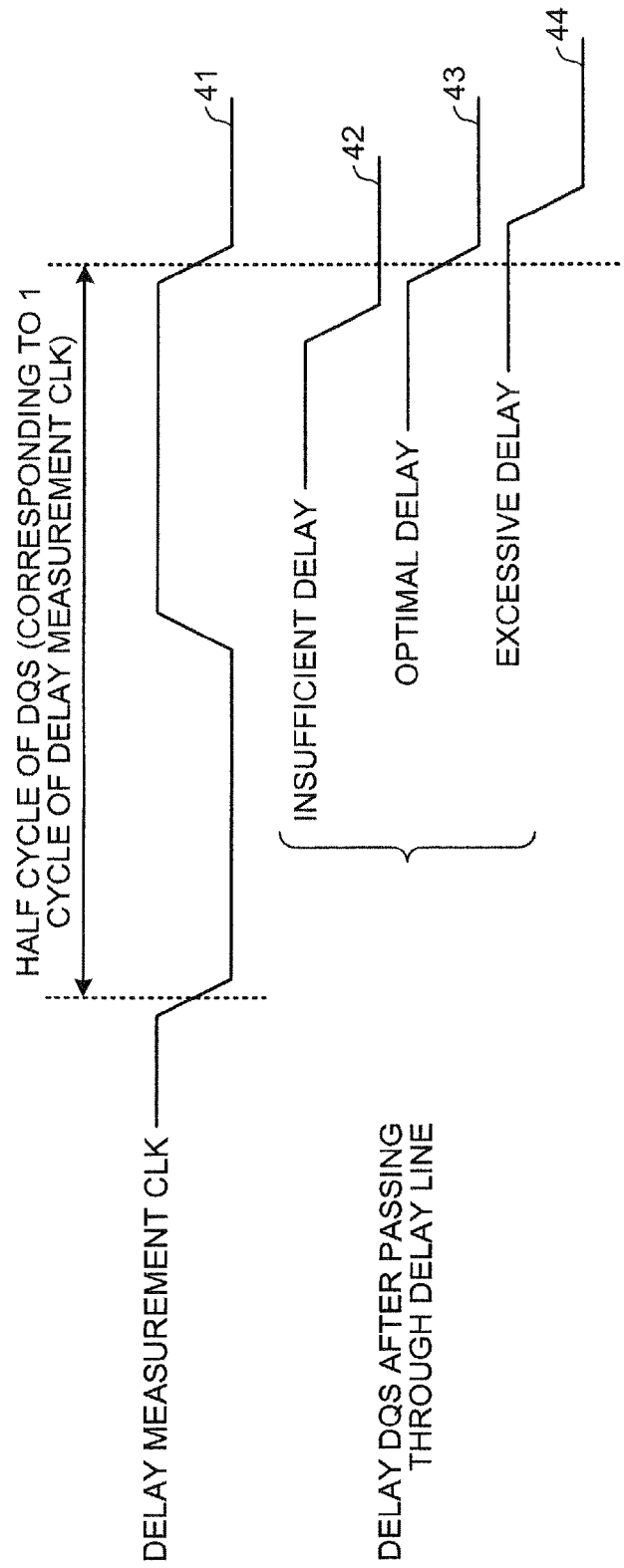
FIG. 4 is a schematic diagram of waveforms at the time of delay measurement using a data strobe signal.

On the other hand, when the input signals to the three flip-flops 35, 36, and 37 are the delay data strobe signals, the signals are as follows. FIG. 4 is a schematic diagram of waveforms at the time of delay measurement using the data strobe signal. As depicted in FIG. 4, a half cycle of the data strobe signal is equivalent to one cycle of the delay measurement clock signal. If the delay values match, a falling edge of the delay data strobe signal coincides with every other falling edge of the delay measurement signal.

When the phase of a falling edge of the delay data strobe signal and the phase of a falling edge of the delay measurement clock signal are compared, if the value of a delay data strobe signal 42 is L (low) level, the delay is insufficient; if the value of a delay data strobe signal 44 is H (high) level, the delay is excessive. When the delay is optimal, a falling edge of the delay measurement clock signal 41 overlaps with a changing point of the delay data strobe signal 43, and the value of the delay data strobe signal 43 is undefined.

Accordingly, in the phase comparing circuit 31 depicted in FIG. 3, the input signals of the three flip-flops 35, 36, and 37 are all at the L (low) level when the delay is insufficient, and are all at the H (high) level when the delay is excessive. When the delay is optimal, the input signals to the first flip-flop 35 and the third flip-flop 37 are at the L (low) level and the H (high) level, respectively, and the input signal to the second flip-flop 36 is undefined.

Therefore, the logic of the phase comparator 38 when the delay data strobe signal is input is the inverse of that in a case where the delay clock signal is input. The phase comparator 38 is configured such that the logic when the delay clock signal is input through an input selecting signal to the selector 21 and the Logic when the delay data strobe signal is input through an input selecting signal to the selector 21 are inverses one another. For example, the delay clock signals are directly input to the phase comparator 38 from the three flip-flops 35, 36, and 37. The delay data strobe signals are input to the phase comparator 38 from the three flip-flops 35, 36, and 37 through an inverter.

As described, even when time to perform update of the reference delay value decreases because of a successive read of the maximum burst length, fine control of the reference delay value is possible. Moreover, in DDR2, data read can be performed successively by a posted column address strobe (CAS) operation; and in this case, by an interrupt of the update comparing unit 34, the memory controller is caused to stop the posted CAS operation temporarily to update the reference delay value during the stop.

Configuration may be such that an updating condition of the reference delay value based on the delay measurement clock signal and an updating condition of the reference delay value based on the data strobe signal are managed separately, and the update of the reference delay value based on each of the updating conditions is performed independently. Alternatively, configuration may be such that update of the reference delay signal is performed combining both of the updating conditions. By various register settings described later, either configuration can be selected.

Figure 5:
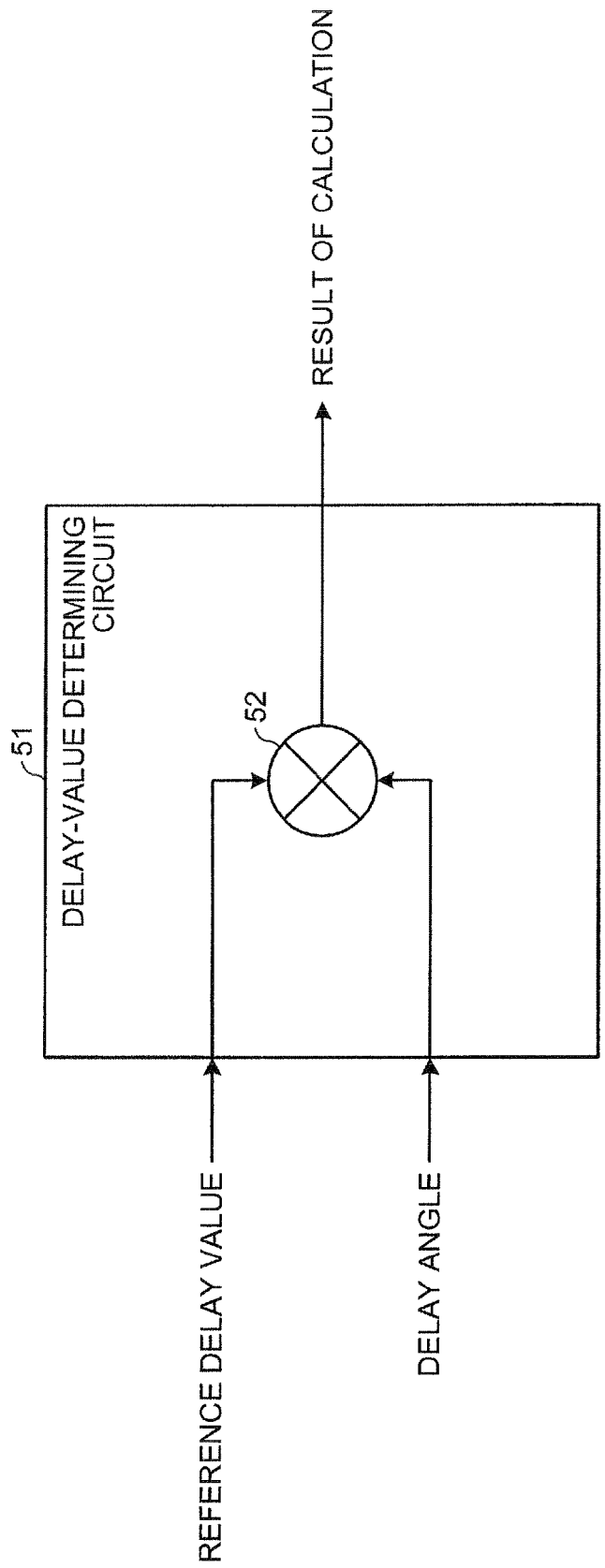
FIG. 5 is a schematic depicting a configuration of a delay-value determining circuit.

FIG. 5 is a schematic depicting a configuration of the delay-value determining circuit. As depicted in FIG. 5, a delay-value determining circuit 51 includes a multiplier 52. The multiplier 52 multiplies a delay angle that is set externally and the reference delay value, and outputs the result of the multiplication as a final value of the delay to be induced on the data strobe signal.

Figure 6:
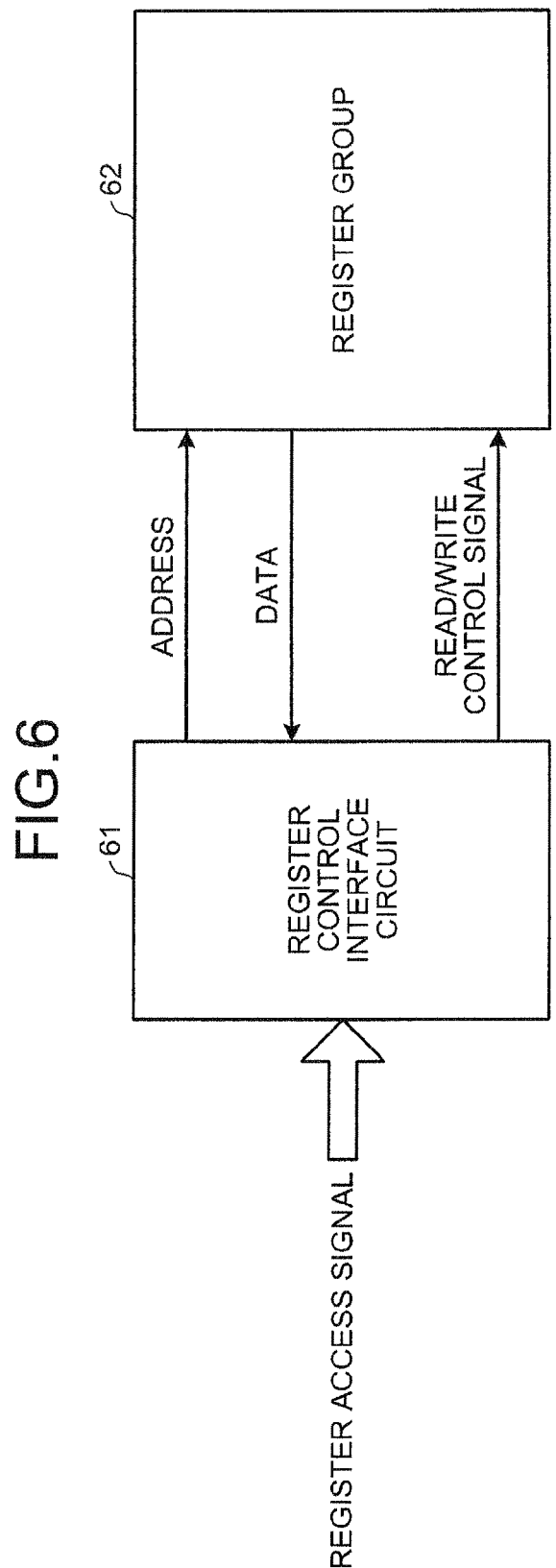
FIG. 6 is a schematic depicting a configuration of a data storage area.

FIG. 6 is a schematic depicting a configuration of the data storage area. As depicted in FIG. 6, the data storage area includes a register control interface circuit 61 and a register group 62. The register control interface circuit 61 outputs, based on an internal register access signal, an address signal and a read control signal to the register group 62, and reads corresponding data from the register group 62. Furthermore, the register control interface circuit 61 outputs the address signal, data to be written in the register group 62, and a write control signal. The register group 62 includes a register group related to reference delay value update and a register group related to an actual delay amount.

Figure 7:
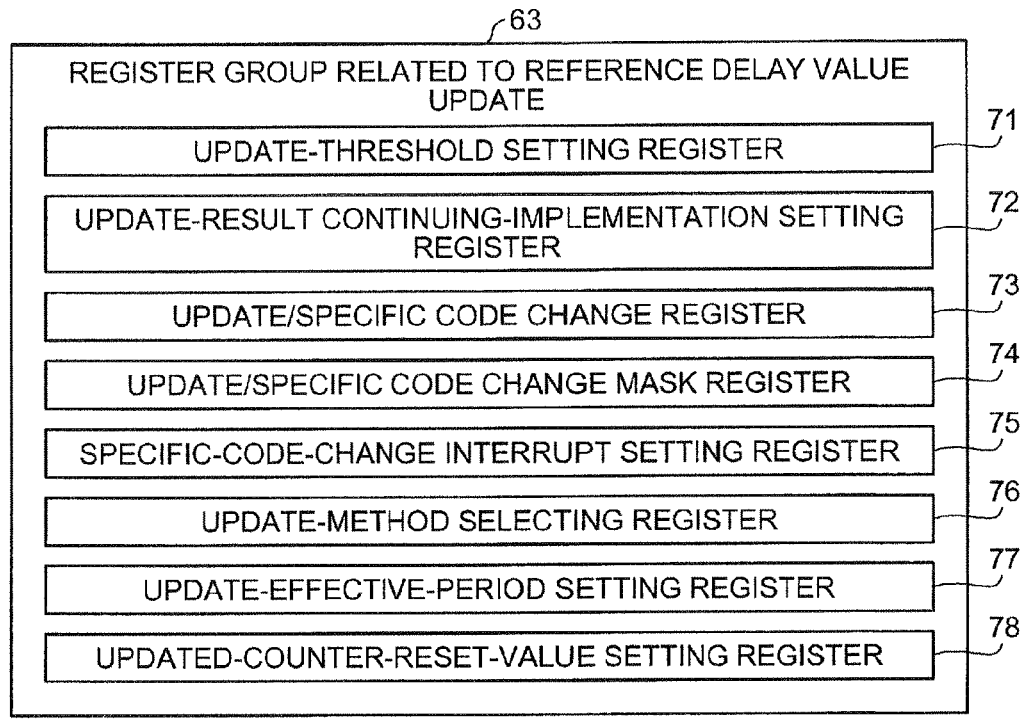
FIG. 7 is a schematic depicting a configuration of a register group related to reference delay value update.

FIG. 7 is a schematic depicting a configuration of a register group related to reference delay value update. As depicted in FIG. 7, a register group 63 related to reference delay value update includes an update-threshold setting register 71, an update-result continuing-implementation setting register 72, an update/specific code change register 73, an update/specific code change mask register 74, a specific-code-change interrupt setting register 75, an update-method selecting register 76, an update-effective-period setting register 77, and an updated-counter-reset-value setting register 78.

Figure 8:
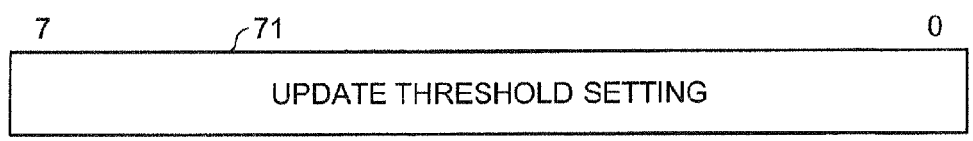
FIG. 8 is a schematic depicting a configuration of an update-threshold setting register.

FIG. 8 is a schematic depicting a configuration of the update-threshold setting register. The update-threshold setting register 71 is a register for setting a threshold for update of the reference delay value, and determines update timing of the reference delay value based on the number of updates of the up counter 32 or the down counter 33. For example, when the number of updates of a counter at which the reference delay value is to be updated is set to the [4+update-threshold setting value]-th power of 2 and if the update threshold is "0h", the reference delay value is updated when the up counter 32 or the down counter 33 is updated 2-to-the-fourth-power times, that is, 16 times.

Moreover, for example, when the update threshold is "ffh", the reference delay value is updated when the up counter 32 or the down counter 33 is updated 2-to-the-[4+15] th-power times, that is 524288 times. Two units of the update-threshold setting registers 71 are provided, one each for the update by the delay measurement clock signal and the update by the data strobe signal, and in a configuration in which the update of the reference delay value is performed combining the update condition for the delay measurement clock signal and the update condition for the data strobe signal as described above, an identical value is set in the register for the update by the delay measurement clock signal and the register for the update by the data strobe signal.

Figure 9:
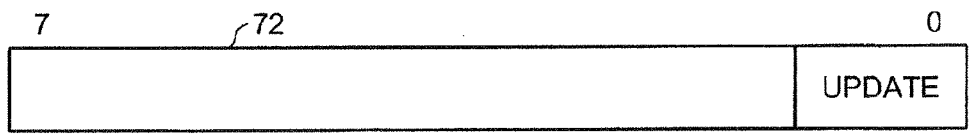
FIG. 9 is a schematic depicting a configuration of an update-result continuing-implementation setting register.

FIG. 9 is a schematic depicting a configuration of the update-result continuing-implementation setting register. The update-result continuing-implementation setting register 72 is a register that adds the counter value for the delay value measurement by the data strobe signal and the counter value for the delay value measurement by the delay measurement clock signal, and sets whether comparison with the threshold is to be performed, concerning update of the reference delay value. For example, when the value of bit 0 of the update-result continuing-implementation setting register 72 is "1", the comparison is performed adding up the counter values; and when the value is "0", the counter values are not added. The reference delay value is updated when the counter values for the delay value measurement by each of the signals by exceeds the threshold.

Figure 10:
FIG. 10 is a schematic depicting a configuration of an update/specific code change register.

FIG. 10 is a schematic depicting a configuration of the update/specific code change register. The update/specific code change register 73 is a register for informing that update of a code (update of the reference delay value) or change to a specific code (change to a specific delay value) has occurred. For example, bit 0 of the update/specific code change register 73 indicates occurrence of the code update, and bit 1 indicates occurrence of change to a specific code. In either case, the value of the corresponding bit is set to "1" when such event occurs.

Figure 11:
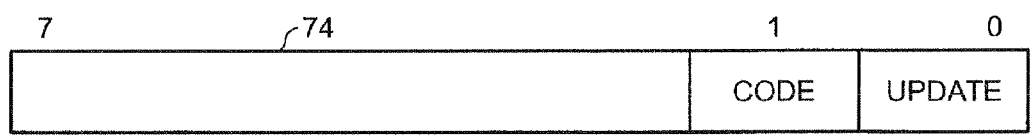
FIG. 11 is a schematic depicting a configuration of an update/specific-code-change mask register.

FIG. 11 is a schematic depicting a configuration of the update/specific-code-change mask register. The update/specific code change mask register 74 is an interrupt mask register that has the same bit arrangement as the update/specific code change register 73. For example, when the value of a corresponding bit of the update/specific code change mask register 74 is "1", even if update of a code or change to a specific code occurs, interrupt is masked and the interrupt does not occur.

Figure 12:
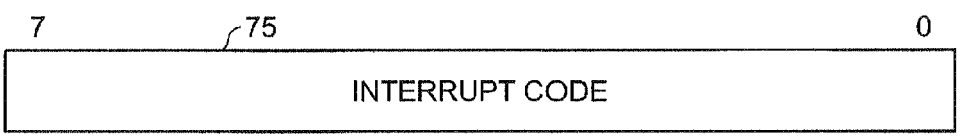
FIG. 12 is a schematic depicting a configuration of a specific-code-change interrupt setting register.

FIG. 12 is a schematic depicting a configuration of a specific-code-change interrupt setting register. The specific-code-change interrupt setting register 75 is a register for setting a specific code when change to the specific code occurs. When a code changes to the value set in the specific-code-change interrupt setting register 75, the value of a code change bit (bit 1) of the update/specific code change register 73 becomes "1".

Figure 13:
FIG. 13 is a schematic depicting a configuration of an update-method selecting register.

FIG. 13 is a schematic depicting a configuration of the update-method selecting register. The update-method selecting register 76 is a register for performing settings concerning an update method of the reference delay value. Bit 0 of the update-method selecting register 76 is a bit for setting whether to set an effective period for the up counter 32 and the down counter 33 when the reference delay value is updated. When the value of bit 0 is "1", an effective period is to be set, and when the value is "0", an effective period is not to be set. When an effective period is set, if the counter value of the up counter 32 or the down counter 33 does not reach the update threshold within the effective period, the reference delay value is not updated, and the up counter 32 and the down counter 33 are reset once the effective period is over.

Bit 1 of the update-method selecting register 76 is a bit that determines the counting method of the up counter 32 and the down counter 33, where if the value is "1", count of the respective counters 32 and 33 are executed separately, and if the value is "1", subtraction is performed between the counter values of the counters 32 and 33. Bit 2 of the update-method selecting register 76 is a bit for setting counter reset of the up counter 32 and the down counter 33, and if the value is "1", the down counter 33 is reset at the time of update of the up counter 32, and the up counter 32 is reset at the time of update of the down counter 33.

When such reset is performed, the reset frequency of one counter is based on the number of updates of the other counter, the number of updates being set by the updated-counter-reset-value setting register 78 described later. If the value of bit 2 of the updated-counter-reset-value setting register 78 is "0", the counter is not reset even when the other counter is updated.

Figure 14:
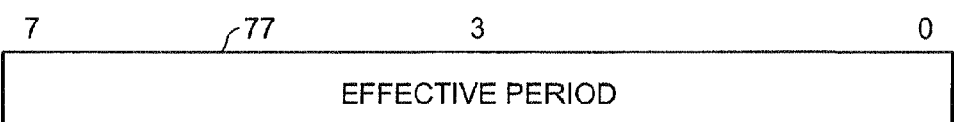
FIG. 14 is a schematic depicting a configuration of an update-validity-term setting register.

FIG. 14 is a schematic depicting a configuration of the update-validity-term setting register. The update-effective-period setting register 77 sets an effective period to update the up counter 32 and the down counter 33. For example, concerning balance with the threshold to update the reference delay value, the effective period is 2-to-the-[6+update-validity-term setting value] th-power or the like.

Figure 15:
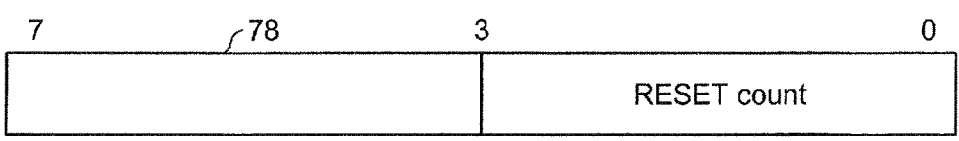
FIG. 15 is a schematic depicting a configuration of an updated counter reset value setting register.

FIG. 15 is a schematic depicting a configuration of the updated counter reset value setting register. The updated-counter-reset-value setting register 78 sets the number of updates that one counter is to reach prompting reset of the other counter. When the up counter 32 is updated for the number of times that is obtained by adding 1 to the setting value of the updated-counter-reset-value setting register 78, the down counter 33 is reset. Moreover, when the down counter 33 is updated for the number of times that is obtained by adding 1 to the setting value of the updated-counter-reset-value setting register 78, the up counter 32 is reset.

Figure 16:
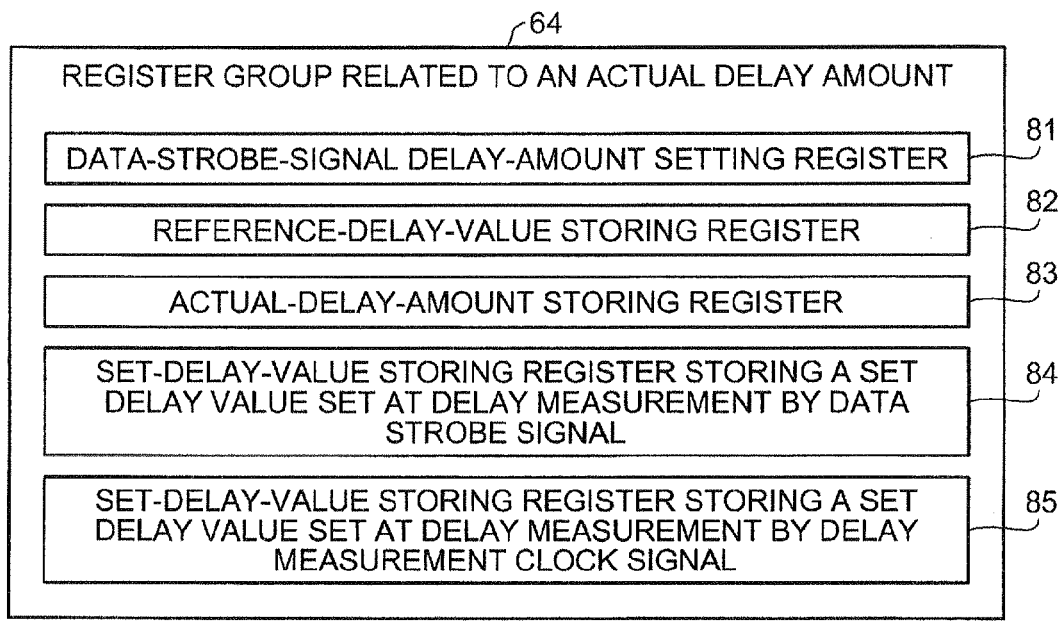
FIG. 16 is a schematic depicting a configuration of a register group related to an actual delay amount.

FIG. 16 is a schematic depicting a configuration of the register group related to an actual delay amount. As depicted in FIG. 16, a register group 64 related to an actual delay amount includes a data-strobe-signal delay-amount setting register 81, a reference-delay-value storing register 82, an actual-delay-amount storing register 83, a set-delay-value storing register 84 storing a set delay value set at the delay measurement that uses the data strobe signal, and a set-delay-value storing register 85 storing a set delay value set at the delay measurement that uses the delay measurement clock signal.

Figure 17:
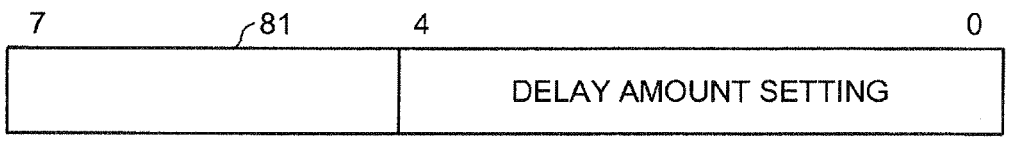
FIG. 17 is a schematic depicting a configuration of a data-strobe-signal delay-amount setting register.

FIG. 17 is a schematic depicting a configuration of the data-strobe-signal delay-amount setting register. The data-strobe-signal delay-amount setting register 81 is a register for setting a delay amount of the data strobe signal based on the reference delay value. For example, a delay amount expressed by an equation, [delay amount of the data strobe signal=reference delay value×delay amount setting value÷32], is added to the data strobe signal.

For example, when a half of the reference delay value, that is, the delay amount equivalent to ¼ cycle (corresponding to 90 degrees) of the clock signal of the DDR memory interface, is added to the data strobe signal, "0fh" is set in the data-strobe-signal delay-amount setting register 81. When the delay amount to be added to the data strobe signal is determined by the expression above, a delay amount can be set to the clock signal of the DDR memory interface in steps of 5.625 degrees.

The reference-delay-value storing register 82 is a register that stores a reference delay value. The actual-delay-amount storing register 83 is a register that stores an actual delay amount. The set-delay-value storing register 84 stores a delay value that is set at the delay measurement that uses the data strobe signal. The set-delay-value storing register 85 is a register that stores a delay value at the delay measurement that uses the delay measurement clock signal.

The reference-delay-value storing register 82, the actual-delay-amount storing register 83, the set-delay-value storing register 84, and the set-delay-value storing register 85 are internal registers. Therefore, a user cannot write a value to or read a value from the registers.

Figure 18:
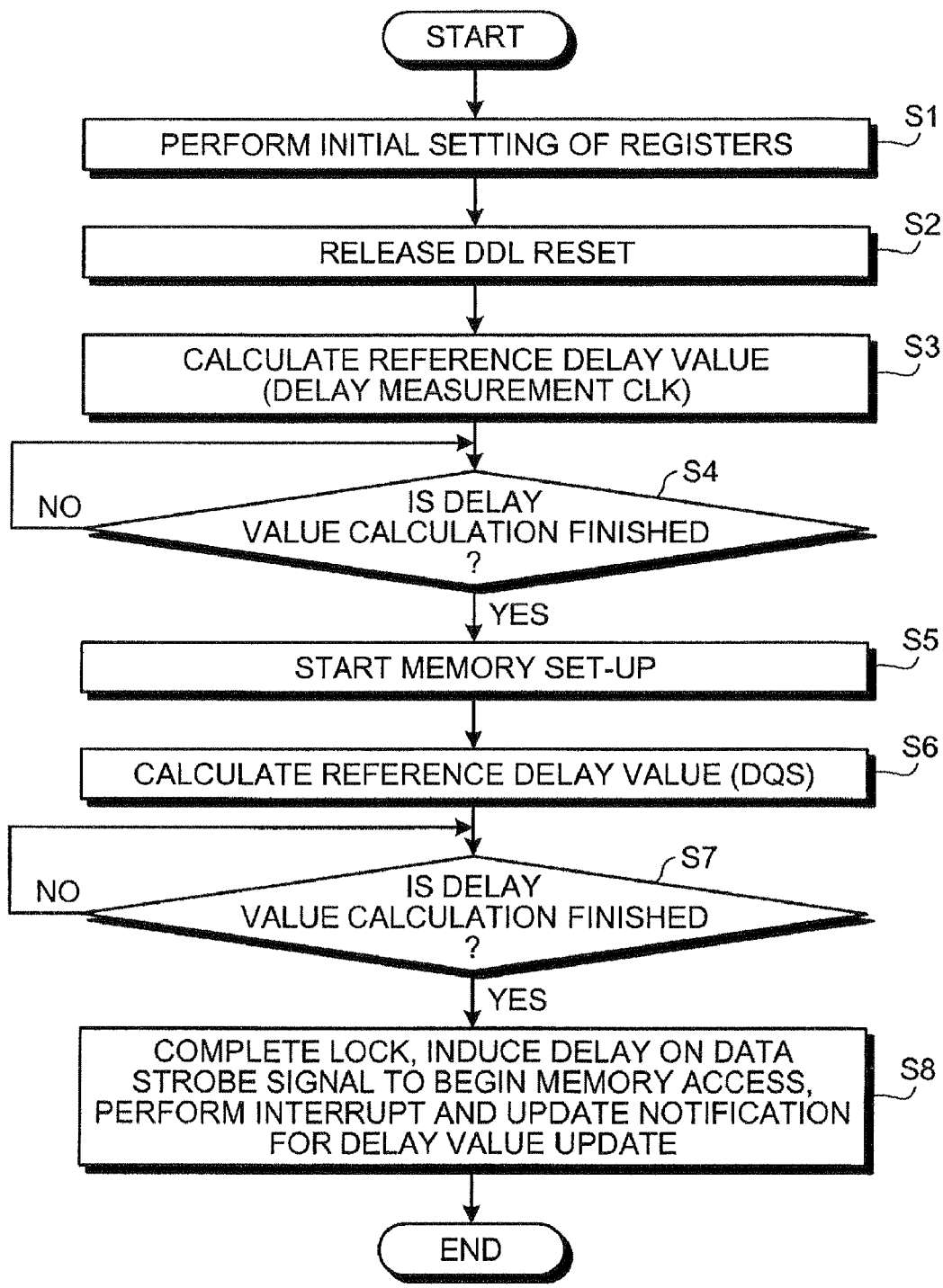
FIG. 18 is a flowchart of a set-up process of the digital DLL circuit.

FIG. 18 is a flowchart of a set-up process of the digital DLL circuit. As depicted in FIG. 18, when the set-up process is started, an initial setting of the respective registers included in the register group 62 described above is performed (step S1).

Subsequently, reset of the digital DLL circuit is released (step S2). The reference delay value is then calculated by the delay measurement that uses the delay measurement clock signal (step S3). A value delay indicative of the delay to be induced on the data strobe signal is calculated based on the reference delay value calculated at step S3, and it is determined whether the calculation has finished (step S4).

When the calculation of the delay value has not finished (step S4: "NO"), waiting occurs until the calculation is finished, and when the calculation has finished (step S4: "YES"), set-up of the memory is started (step S5). Up to this process, the delay measurement clock signal is input to the digital DLL circuit. Next, the data strobe signal is input to the digital DLL circuit, and the reference delay value is calculated by the delay measurement that uses the data strobe signal (step S6). Subsequently, a final delay value indicative of the final delay to be induced on the data strobe signal is calculated based on the reference delay value calculated at step S6, and it is determined whether the calculation has finished (step S7).

When the calculation of the delay value has not finished (step S7: "NO"), waiting occurs until the calculation is finished. This operation is to confirm that the delay value obtained by the delay measurement that uses the delay measurement clock signal and the delay value obtained by the delay measurement that uses the data strobe signal coincide. When the calculation of the delay value is finished at step S7 (step S7: "YES"), lock is completed and a state is established where memory access can be started by actually inducing the delay on the data strobe signal. Furthermore, a state is established where update of the delay value by the delay measurement that uses the delay measurement clock signal and occurs between memory accesses, update of the delay value by the delay measurement that uses the strobe signal and occurs during the memory access and, interrupt and update notification to update the delay value can be performed at any time (step S8). Thus, the set-up sequence is ended.

Figure 19:
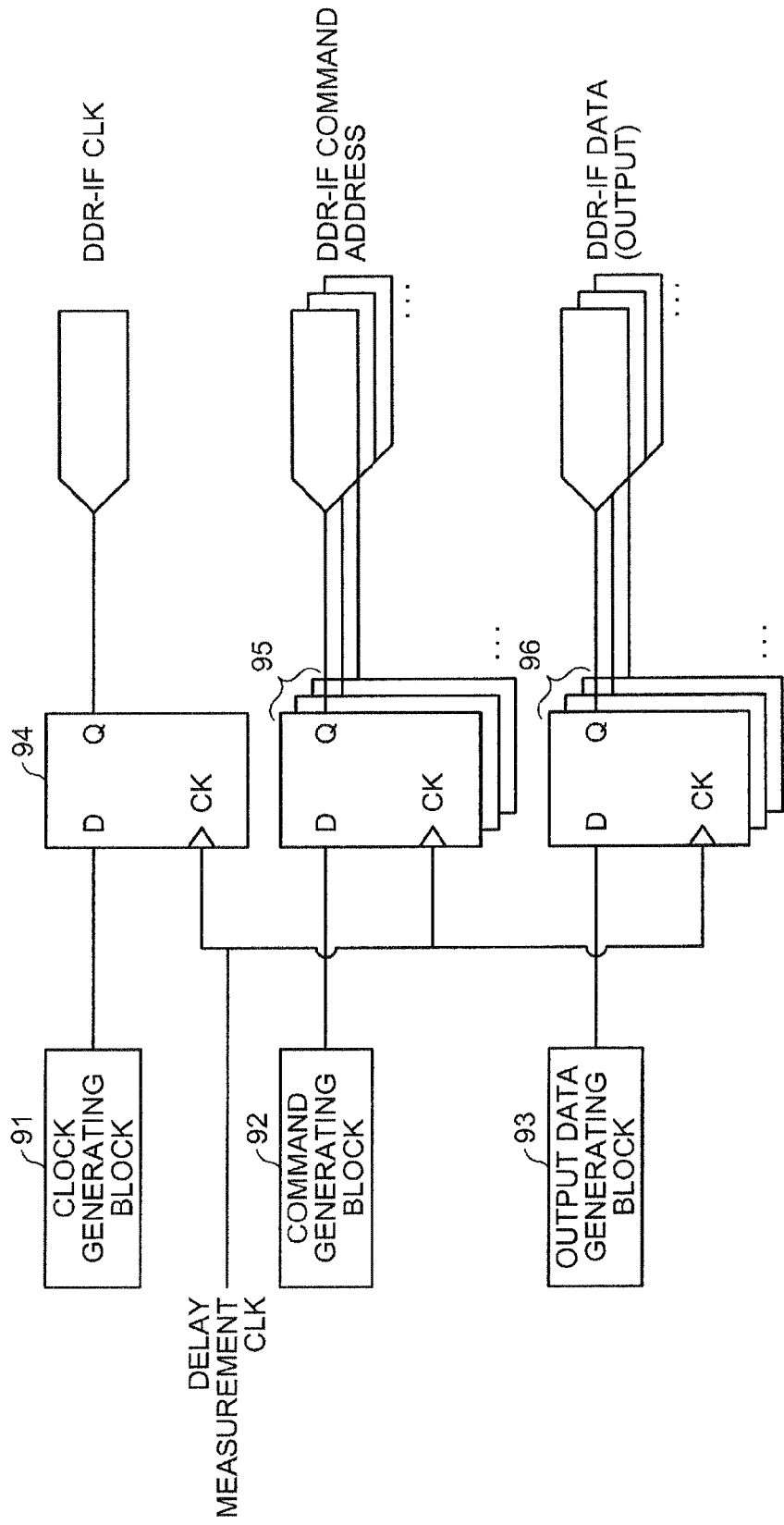
FIG. 19 is a schematic depicting a configuration of a data output unit and a command output unit of a DDR memory interface.
Figure 20:
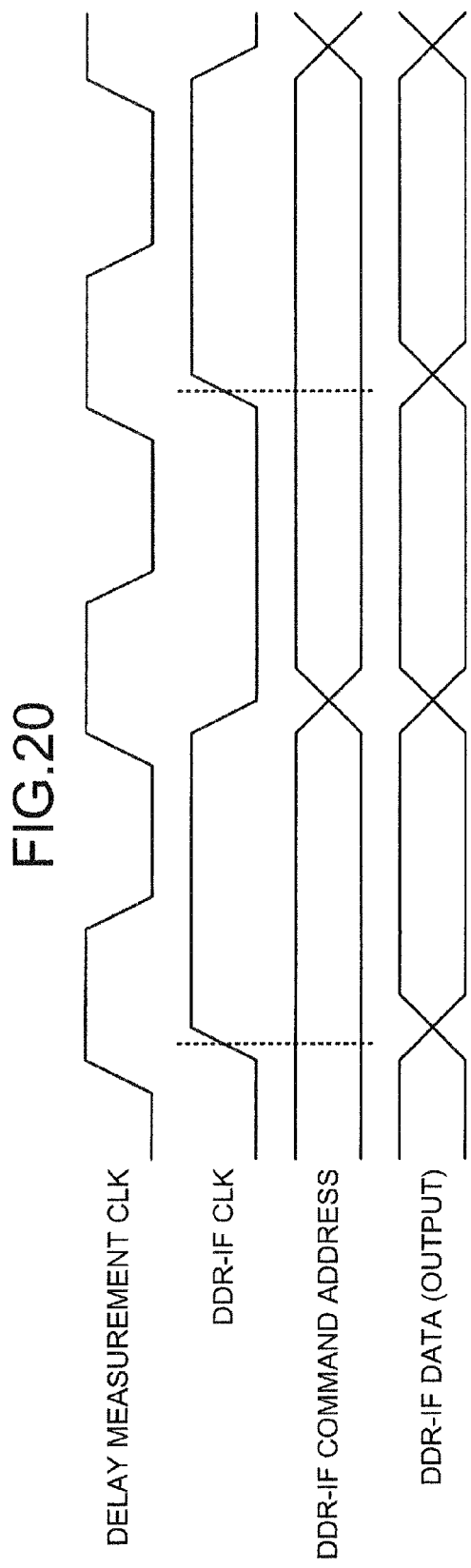
FIG. 20 is a time chart at the time of reading a memory of the DDR memory interface.

The delay measurement clock signal that is input to the DLL circuit up to the process at step S5 has a frequency twice as high as (or higher than) the clock signal input to the memory that is connected to the DDR memory interface, or higher. FIG. 19 is a schematic depicting a configuration of a data output unit and a command output unit of the DDR memory interface. FIG. 20 is a time chart at the time of reading a memory of the DDR memory interface.

As depicted in FIG. 19, signals output from a clock generating block 91, a command generating block 92, and an output data generating block 93 of the memory interface are latched respectively with a flip-flop 94, a flip-flop group 95, and another flip-flop group 96 that respectively operate in synchronization with the delay measurement clock signal. These signals are output to a memory (not depicted) as a clock signal (DDR-IF CLK), a command address (DDE-IF command address), and data (DDR-IF data). Therefore, as depicted in FIG. 20, the delay measurement clock signal has a frequency twice as high as the clock signal (DDR-IF CLK) input to the memory, and is a clock signal that is normally used in the memory interface, and thus, the clock signal is not specially generated in this embodiment.

Furthermore, because the delay measurement clock signal has a frequency twice as high as the clock signal input to the memory, the cycle of the delay measurement clock signal is ½ of the cycle of the clock signal used in the conventional digital DLL circuit. Therefore, the number of delay lines used can be half that conventionally used. Accordingly, the number of delay lines for the delay measurement mode and the number of delay lines for the delay generation mode are the same, and therefore, the same delay line unit can be used during both the delay measurement mode and the delay generation mode in time division. Moreover, when a delay equivalent to 90 degrees of the cycle of the clock signal input to the memory is calculated, while ¼ of the number of delay lines corresponding to a phase of 360 degrees has conventionally been regarded as the number of delay lines, according to the embodiment, it is converted as ½ of the number of delay lines.

Figure 21:
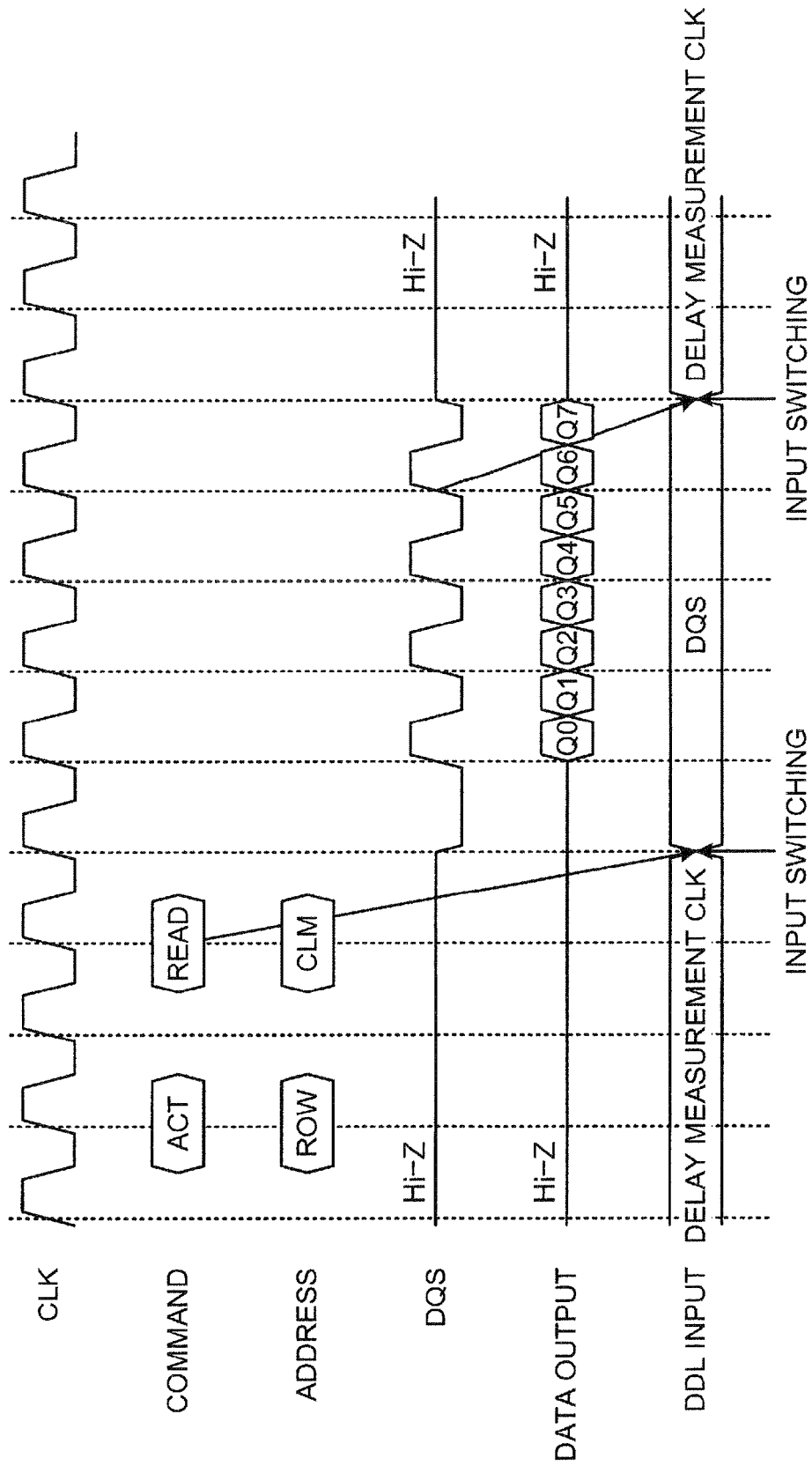
FIG. 21 is a chart depicting switching timing of an input signal of the digital DLL circuit according to the embodiment.

FIG. 21 is a chart depicting switching timing of an input signal of the digital DLL circuit according to the embodiment. As depicted in FIG. 21, after the reference delay value is measured using the delay measurement clock signal, the data strobe signal is input, and the delay induced on the data strobe signal is generated. At this time, timing at which the data strobe signal is input to the digital DLL circuit is after a CAS latency has elapsed since a read command is output.

Therefore, preferably, the memory interface generates an input switching signal in a period after the read command is output and before the CAS latency elapses, to switch the input signal to the digital DLL circuit from the delay measurement clock signal to the data strobe signal. At the same time as the switching of the input signal, the phase comparing circuit 31 of the phase-comparing/delay-value determining/data storage unit 24 is controlled not to perform comparison of the phase of the delay measurement clock signal and the phase of the delay clock signal. Furthermore, completion of read access is recognized based on burst length, and the input signal is switched from the data strobe signal to the delay measurement clock signal.

Figure 22:
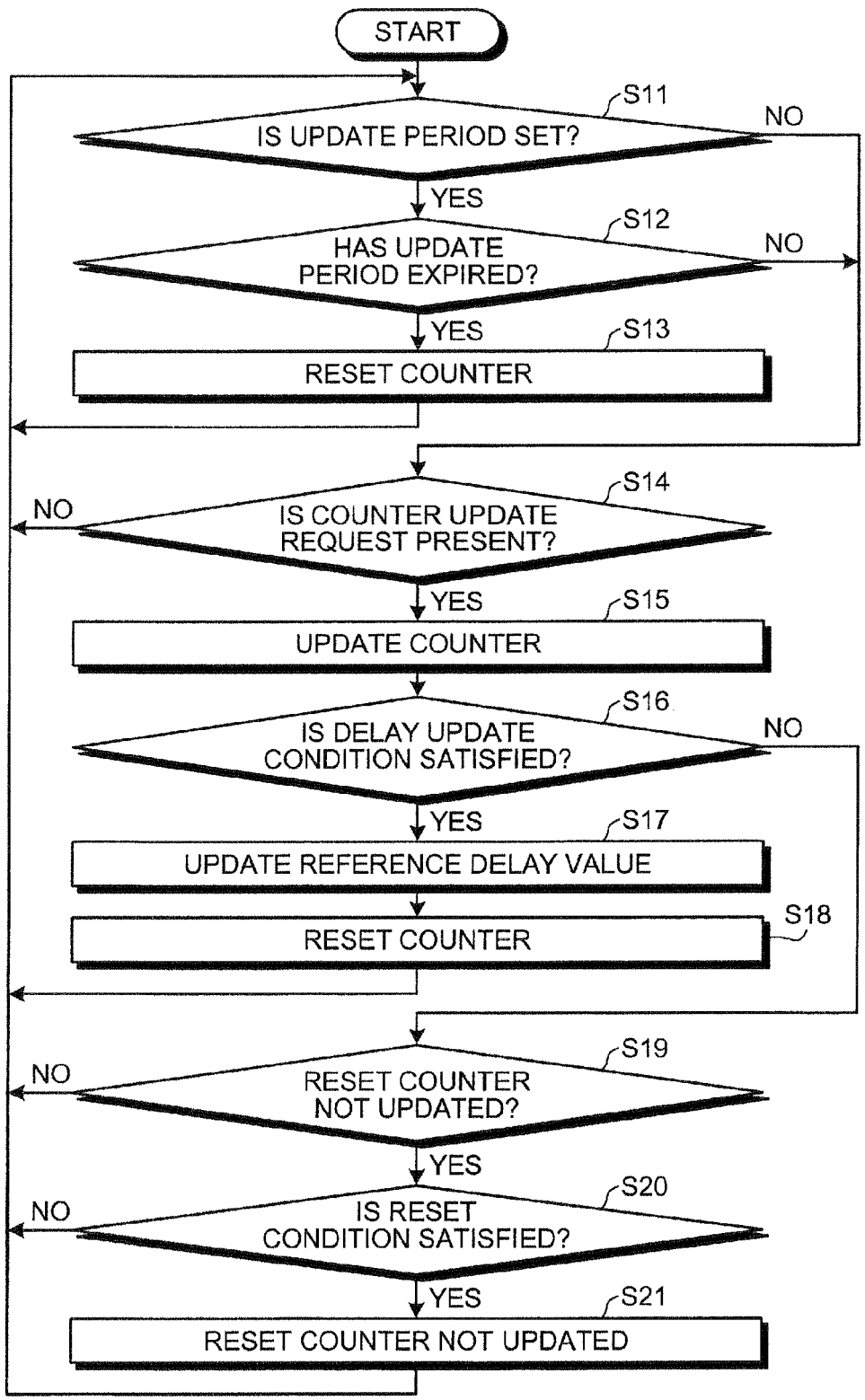
FIG. 22 is a flowchart of a reference-delay-value updating process performed by the digital DLL circuit according to the embodiment.
Figure 23:
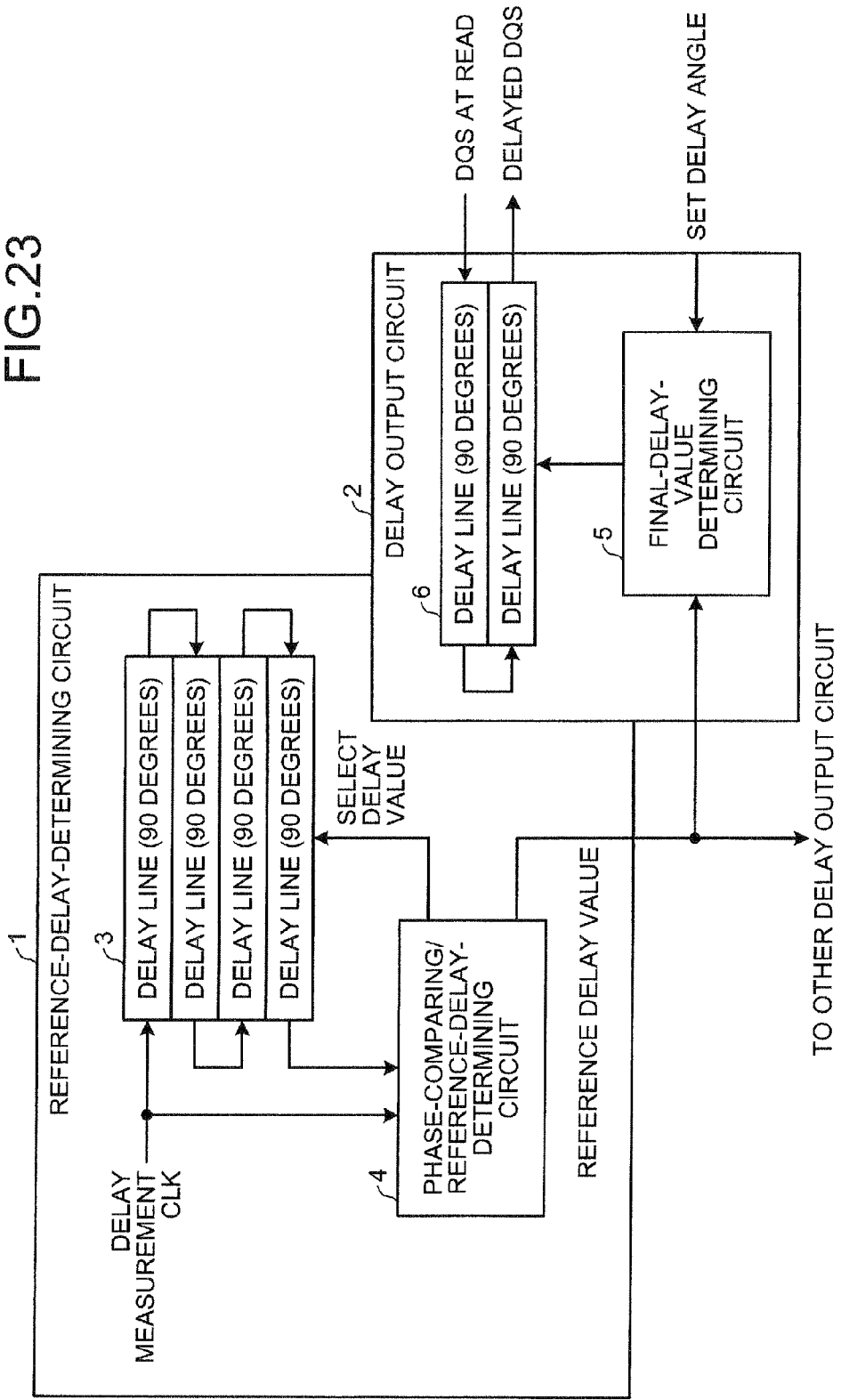
FIG. 23 is a schematic depicting a configuration of a conventional digital DLL circuit.

FIG. 22 is a flowchart of a reference-delay-value updating process performed by the digital DLL circuit according to the embodiment. As depicted in FIG. 22, when the reference-delay-value updating process is started, it is determined, by reference to bit 0 of the update-method selecting register 76, whether an update period that is an effective period at the time of updating the up counter 32 and the down counter 33 is set (step S11).

When the update period is set (step S11: "YES"), it is determined, by reference to the update-effective-period setting register 77, whether the update period has expired (step S12). When the update period has expired (step S12: "YES"), the counter value of the up counter 32 and the down counter 33 are initialized (step S13), and the process returns to step S11. When it is determined that the update period is not set at step S11 (step S11: "NO"), or when it is determined that the update period has not expired (step S12: "NO"), it is determined whether a counter activating signal requesting counter update has been output from the phase comparator 38 (step S14).

If neither the up counter activating signal nor the down counter activating signal is asserted (step S14: "NO"), the process returns to step S11. When an activating signal of either one of the counters is asserted (step S14: "YES"), the counter for which the activating signal is asserted is updated (step S15). It is then determined, by reference to the update-threshold setting register 71 and the update-result continuing-implementation setting register 72, whether the condition to update the reference delay value (delay update conditions) is satisfied, that is whether the counter value of either the up counter 32 or the down counter 33 reaches the threshold (step S16).

When the counter value reaches the threshold (step S16: "YES"), the reference delay value is updated (step S17), and the up counter 32 and the down counter 33 are reset to initialize the respective counter values (step S18). The process then returns to step S31. On the other hand, when it is determined that the update condition is not satisfied at step S16 (step S16:

"NO"), it is determined, by reference to bit 2 of the update-method selecting register 76, whether setting is such that when the up counter 32 or the down counter 33 is updated, the counter not updated is to be reset (step S19).

When such setting is set (step S19: "YES"), it is determined, by reference to the updated-counter-reset-value setting register 78, whether conditions to reset the other counter not updated are satisfied, that is, whether the number of updates of the updated counter has reached a predetermined number (step S20). When the predetermined number of updates have been performed (step S20: "YES"), the counter not updated is reset to initialize the counter value thereof (step S21), and the process returns to step S31. When it is determined that it is not set such that the counter not updated is to be reset (step S19: "NO"), or when the number of updates of the updated counter is insufficient (step S20: "NO"), the process returns to step S11.

As described, according to the embodiment, because the measurement of the reference delay value and the generation of delay to be induced on the data strobe signal are performed using the same delay lines 22 and 23, variation in a process condition at manufacturing, or a temperature or voltage condition at actual utilization can be eliminated. Thus, delay can be generated accurately. Moreover, because delay lines are not provided separately for measurement of the reference delay value and for generation of delay to be induced on the data strobe signal, the circuit scale becomes relatively smaller and power consumption decreases. Hence, miniaturization of the circuit scale and reduction of power consumption can be achieved. Furthermore, while the delay lines 22 and 23 are being used to induce delay on the data strobe signal, measurement of the reference delay value using the same delay lines 22 and 23 cannot be performed; hence, the delay value does not change during induction of delay to the data strobe signal. Therefore, malfunction due to the update of the delay value can be prevented.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A digital delay locked loop circuit that generates a delay value to delay timing of taking in read-data by a memory interface when data is read from a memory, the digital delay locked loop circuit comprising:
   a selector that selects either one of a clock signal and a data strobe signal as a signal to output;
   a delay line that induces delay on the signal output from the selector when the signal passes through the delay line; and
   a phase-comparing/delay-value determining unit that compares a phase of the clock signal and a phase of the signal output from the delay line, and that determines a delay value that defines an amount of delay to be induced on the data strobe signal when passing through the delay line, wherein
   the clock signal has a frequency twice as high as, or higher than a clock signal input to the memory.

2. The digital delay locked loop circuit according to claim 1, wherein the phase-comparing/delay-value determining unit updates the delay value, based on a phase of the clock signal that is output from the delay line when the selector selects the clock signal.

3. The digital delay locked loop circuit according to claim 2, wherein the phase-comparing/delay-value determining unit updates the delay value based on a phase of the data strobe signal that is output from the delay line when the selector selects the data strobe signal.

4. The digital delay locked loop circuit according to claim 3, wherein the phase-comparing/delay-value determining unit does not perform update of the delay value while read-data is being taken in using the data strobe signal that is output from the delay line.

5. The digital delay locked loop circuit according to claim 3, wherein the phase-comparing/delay-value determining unit includes a setting unit that separately sets a condition for updating the delay value based on a phase of the clock signal output from the delay line and a condition for updating the delay value based on a phase of the data strobe signal output from the delay line.

6. The digital delay locked loop circuit according to claim 3, wherein the phase-comparing/delay-value determining unit includes a storing unit that stores a delay value that is used when update of the delay value is performed based on a phase of the clock signal output from the delay line and a delay value that is used when update of the delay value is performed based on a phase of the data strobe signal output from the delay line.

7. The digital delay locked loop circuit according to claim 6, wherein the phase-comparing/delay-value determining unit includes a delay-value updating unit that compares a condition for updating the delay value with a sum of the number of times the delay value is detected to be excessive based on the phase of the clock signal output from the delay line and the number of times the delay value is detected to be excessive based on the phase of the data strobe signal output from the delay line, or with a sum of the number of times the delay value is detected to be insufficient based on the phase of the clock signal output from the delay line and the number of times the delay value is detected to be insufficient based on the phase of the data strobe signal output from the delay line, and correspondingly updates the delay value stored in the storing unit.

8. The digital delay locked loop circuit according to claim 5, wherein the phase-comparing/delay-value determining unit, by an interrupt, notifies a memory controller of a need for update when the delay value is updated.

9. The digital delay locked loop circuit according to claim 8, wherein the phase-comparing/delay-value determining unit updates the delay value while memory access is interrupted by the interrupt.

10. The digital delay locked loop circuit according to claim 7, wherein the phase-comparing/delay-value determining unit, by an interrupt, notifies a memory controller of a need for update when the delay value is updated.

11. The digital delay locked loop circuit according to claim 10, wherein the phase-comparing/delay-value determining unit updates the delay value while memory access is interrupted by the interrupt.

* * * * *